United States Patent [19]

Katayama et al.

[11] Patent Number: 5,323,344
[45] Date of Patent: Jun. 21, 1994

[54] QUANTUM MEMORY DEVICE

[75] Inventors: Kozo Katayama, Koganei; Shiroo Kamohara, Kokubunji, both of Japan

[73] Assignee: Hitachi, Ltd., Tokyo, Japan

[21] Appl. No.: 880

[22] Filed: Jan. 5, 1993

[30] Foreign Application Priority Data

Jan. 9, 1992 [JP] Japan .................................. 4-002066

[51] Int. Cl.$^5$ ...................... G11C 11/44; H01L 39/10
[52] U.S. Cl. .................... 365/162; 365/210; 257/31; 505/832; 505/841
[58] Field of Search ............... 365/160, 161, 162, 210, 365/222; 257/31; 307/306; 505/831, 832, 838, 841

[56] References Cited

U.S. PATENT DOCUMENTS 5,051,787 9/1991 Hasegawa ..................... 365/162 X
5,075,736 12/1991 Wada .................................. 257/31

OTHER PUBLICATIONS

A. J. Leggett et al., "Quantum Mechanics Versus Macroscopic Realism: Is the Flux There When Nobody Looks?", Physical Review Letters, vol. 54, No. 9, Mar. 4, 1985, pp. 857–860.
C. D. Tesche, "Can a Noninvasive Measurement of Magnetic Flux be Performed with Superconducting Circuits?", Physical Review Letters, vol. 64, No. 20, May 14, 1990, pp. 2358–2361.
K. K. Likharev, "Single-Electron Transistors: Electrostatic Analogs of the De Squids", IEEE Transactions on Magnetics, vol. MAG-23, No. 2, Mar. 1987, pp. 1142–1145.

*Primary Examiner*—Joseph A. Popek
*Attorney, Agent, or Firm*—Antonelli, Terry, Stout & Kraus

[57] ABSTRACT

A quantum memory device in which a memory operation is enabled even if the structure of a Josephson device is reduced in size. Each memory cell of the quantum memory device includes a superconducting quantum interference device having two Josephson junctions, a write word line for supplying a current to the superconducting quantum interference device, a write data line and a magnetic field detection line magnetically coupled with the superconducting quantum interference device, a three-terminal switching device for turning a signal of the magnetic field detection line on and off to transfer the signal to a read data line, and a read word line connected to a gate of the three-terminal switching device. The junction area of the Josephson junction is made small to oscillate a magnetic flux so that information is stored in accordance with the phase of oscillation of the magnetic flux. An induced current produced by an oscillating flux of a dummy cell and an induced current produced by an oscillating flux of each memory cell are compared to detect the phases of flux oscillation of the dummy and memory cells, thereby reading information.

23 Claims, 15 Drawing Sheets

MAGNETIC FLUX
TRAPPED IN SUPER-
CONDUCTING RING

210 SUBSTRATE

211 GRAND PLANE
210

213 La-Cu-O FILM
211
212 INSTULATING FILM
210

214 ION IMPLANTATION MASK
213
212
211

QUANTUM MEMORY DEVICE

BACKGROUND OF THE INVENTION

The present invention relates to a memory which uses a quantum effect and from/into which information can arbitrarily be read/written.

A Josephson device is expected as the device which can achieve both a high speed operation and a low power consumption which cannot be realized by semiconductor devices, and the applications of the Josephson device to memories, logical circuits and sensors are proposed. For example, a memory using the Josephson device stores information in a manner of the presence/absence of a magnetic flux trapped in a superconducting ring or the direction of the magnetic flux. It is assumed that the magnitude of the trapped magnetic flux is limited to integer times of the magnetic flux quantum $\phi_0 = h/(2e)$ (h being the Planck's constant and e being the charge of an electron) and that there is a stable state when a magnetic flux integer times as large as the magnetic flux quantum is trapped in the superconducting ring.

An example of a conventional memory cell using Josephson devices is shown in FIG. 1. A superconducting ring 15 trapping a magnetic flux has a DC superconducting quantum interference device (SQUID) structure in which Josephson devices J1 and J2 are inserted. A word line 11 is connected to the SQUID for supplying a current $I_w$ from the exterior. A write data line 12 and a read data line 13 magnetically coupled with the SQUID are provided adjacent to the ring, and a Josephson junction J3 is inserted in the course of the read data line 13. A superconducting loop current 14 (IL) flows in the superconducting ring 15 so that a magnetic flux is trapped in the superconducting ring 15. A relationship between the magnetic flux $\phi$ and the potential energy U of the system in the above SQUID structure is shown in FIG. 2. As shown in the figure, a plurality of stable magnetic flux states exist since the potential energy U takes the minimum values at two points of $\phi = 0$ and $\phi = \phi_0$ when the magnetic flux $\phi$ trapped in the superconducting ring is taken along the abscissa and the potential energy U is taken along the ordinate. Since these states semipermanently endure under a low temperature environment, it is possible to provide a memory by making each state correspond to information to be stored.

This memory cell operates in accordance with a timing chart shown in FIG. 3.

A bias current is flown in the write data line so that a bias magnetic field is applied to the SQUID. In a case where data "0" is to be written into the memory cell, the word line current $I_w$ is brought into a high level and a current larger than a critical current Ic, by which the Josephson junction is transited into a finite-voltage state, and smaller than 2Ic is flown in the word line. When a write data line current $ID_w$ is turned to 0, the devices J1 and J2 are both brought into zero-voltage states so that the current $I_w$ flowing through the word line is bisected. As a result, the magnetic flux passing through the SQUID becomes zero to realize a state of "0". On the other hand, when the write data line current $ID_w$ is turned to not 0 but a high level, a magnetic field produced by $ID_w$ increases the critical current of on of the devices J1 and J2 and decreases the critical current of the other device. As a result, only one of the devices J1 and J2 takes a nonzero-voltage state and the current $I_w$ flows into only the other device of a zero-voltage state so that data "1" is written. Even if $ID_w$ and $I_w$ are thereafter restored to non-write states, a superconducting loop current IL is maintained so that the magnetic flux $\phi_o$ is trapped in the loop.

When data is to be read, the current $I_w$ is brought into the high level in the same manner as at the time of write of data and a current $ID_R$ is flown in the read data line. In a case where data "1" is stored in the memory cell, a magnetic field produced by the current $I_w$ and a magnetic field produced by the current IL interact to enhance each other, thereby decreasing a critical current of the Josephson device J3. As a result, the device J3 exhibits a transition to a finite-voltage state and $V_{out}$ becomes high. In a case where the current IL is 0, the current $ID_R$ is smaller than the critical current and the output $V_{out}$ remains in a zero-voltage state.

In principle, a response on the order of sub-picosecond is expected for a Josephson device when it is used as a single or discrete device. However, in a case where Josephson devices are used to form a system such as a logical circuit or an integrated memory circuit, there has not yet been developed a system which exceeds the limit of the response characteristic of a semiconductor integrated circuit. A further reduction in the size of a Josephson device is needed in order to further improve an operating speed.

However, it is pointed out that a new quantum effect having not hitherto been expected may occur as the area of the junction is reduced (see A. J. Leggett and Anupam Garg, Physical Review Letters, Vol. 54, pp. 857-820, March 1985). Namely, when the capacitance of a Josephson junction decreases as the junction area is reduced, an electrostatic energy possessed by a Cooper pair becomes innegligible as compared with the pairing energy of a Cooper pair. This condition is given by $e^2/C \sim \Delta$ where $\Delta$ is an energy gap of the superconductor and C is the capacitance of the Josephson junction. The magnetic flux state of this SQUID is not localized at the minimum potential point but has a certain broadening based on the uncertainty principle, as shown in FIG. 4. As shown in FIG. 2, there are two states for magnetic flux allowed to settle and transition occurs between these two states due to quantum mechanical fluctuation. Such transition may be understood as tunnel phenominum. As a result, the magnetic flux trapped in a superconducting ring decays due to the tunnel effect with the reduction of the junction area, so that the flux state, in which the magnetic flux integer times as large as the flux quantum is trapped in the superconducting ring, becomes unstable. Therefore, the conventional Josephson memory as shown in FIG. 1 reaches a limit of a storage or memory operation.

SUMMARY OF THE INVENTION

An object of the present invention is to provide an information recording system in which a memory operation is enabled even if the structure of a Josephson device is reduced in size and a memory structure which is based on such a system.

A flux state of a superconducting quantum interference device (SQUID) including a small Josephson junction makes a transition to another flux state due to a tunnel effect. However, in the case where an equivalent resistance R of the Josephson junction is sufficiently large so that the condition of $R > h/(C\Delta)$ is satisfied, an energy dissipation is small and hence the other flux state too is not stable. (Here, h is the Planck's constant, C the capacitance of the Josephson junction, and Δ an energy gap of a superconductor.) And, the flux state of the SQUID returns to the initial or original state again due to the tunnel effect. This process is repeated so that an oscillation of the magnetic flux occurs.

That is, a junction portion of a Josephson device forming the superconducting quantum interference device has a junction area not larger than 0.01 square microns and an energy gap of a superconductor is on the same order as an electrostatic energy of a Cooper pair to cause a quantum fluctuation. A decay time of a magnetic flux trapped in the superconducting quantum interference device due to macroscopic tunnel is shorter than a required data retention time and an equivalent resistance of a Josephson junction of the superconducting quantum interference device is larger than 10 kiloohms so that a magnetic flux subjected to tunnelling returns to the original state again through tunnelling because of a small energy dissipation at the time of macroscopic tunnel and this process is repeated to oscillate the magnetic flux.

In the present invention, a dummy cell is prepared separately from an individual memory cell. A current induced by an oscillating flux of the dummy cell and a current induced by an oscillating flux of the memory cell are compared to detect the phases of the flux oscillations. And, recorded information is read or detected on the basis of the detected phases. The phase of the flux oscillation is determined in accordance with the direction of a data write current at the time of write of data.

Data or information is written by flowing a current in a write word line while flowing a current of a predetermined direction in a write data line. It is assumed that this is the case where information "1" is written. Reversely, in the case where information "0" is to be written, a current of a direction reverse to that in the case of write of information "1" is flown in the write data line. A state in which information "0" or "1" is thus written can be realized in such a manner that a magnetic flux trapped in a superconducting ring is oscillated with a phase reverse to each other.

In the case where data is to be read, a current is flown in a read word line so that a switching device or switching transistor connected to a magnetic flux detection line adjacent to the superconducting ring on one hand and connected to a data line on the other hand is brought into a conducting or ON state. As a result, an induced current flows in the data line due to the oscillation of a magnetic flux of a memory cell from which information is to be read. The phase of this induced current and the phase of an induced current of a dummy cell oscillating at the same frequency as that of the flux oscillation of the memory are compared with each other to detect information stored in the memory cell.

In the present invention, not the presence/absence of a magnetic flux trapped in a superconducting ring but the phase of oscillation of the magnetic flux is stored as information. Therefore, it is possible to avoid the problem of information vanishing due to the tunnel effect. Also, it is possible to attain the reduction in size of a junction area which has hitherto been limited in the conventional Josephson device due to thermal fluctuation or quantum-mechanical fluctuation. A decrease of the capacitance of the junction attendant upon the reduction in size of the junction area brings about the decrease of a time of transition from a voltage state to a zero-voltage state, thereby attaining both a high integration and a high speed.

DESCRIPTION OF THE PREFERRED EMBODIMENTS

Figure 1:
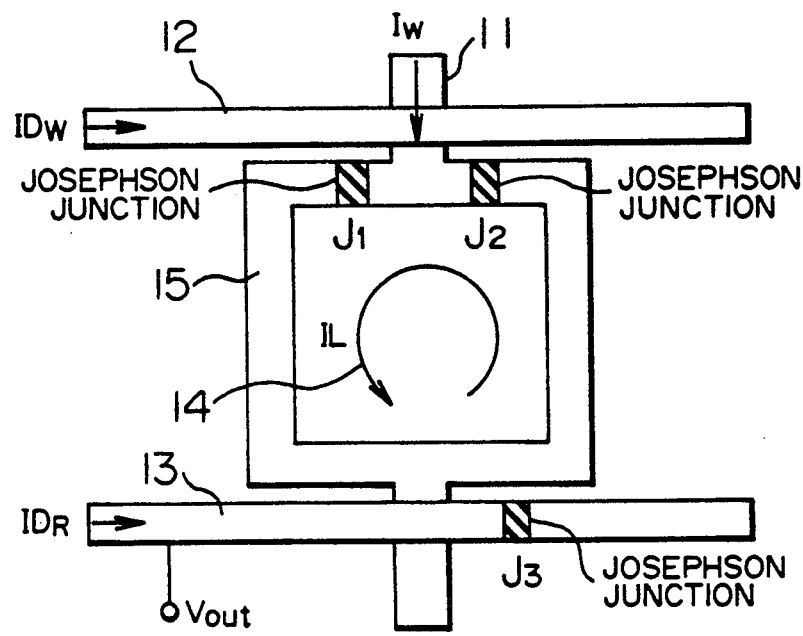
FIG. 1 shows the conventional Josephoson memory cell using a SQUID.
Figure 2:
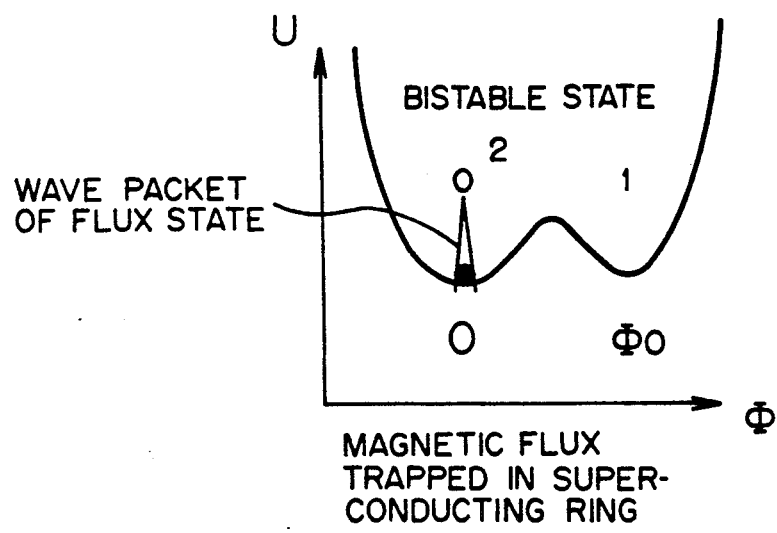
FIG. 2 shows the potential energy of a flux state of the SQUID.
Figure 3:
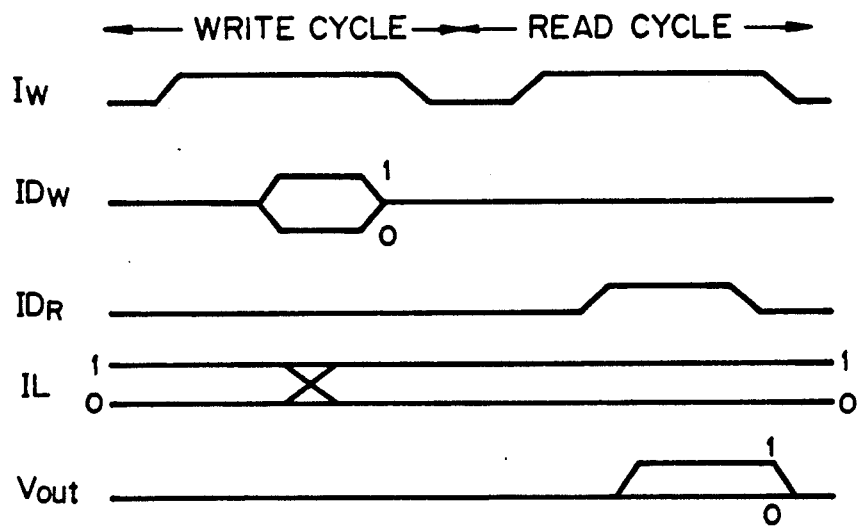
FIG. 3 shows a timing chart of the operation of the conventional Josephson memory using a SQUID.
Figure 4:
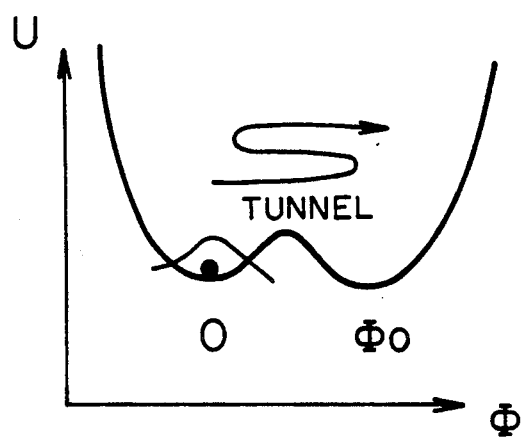
FIG. 4 shows the broadening of a flux state in a quantum flux oscillation memory based on the uncertainty principle.
Figure 5:
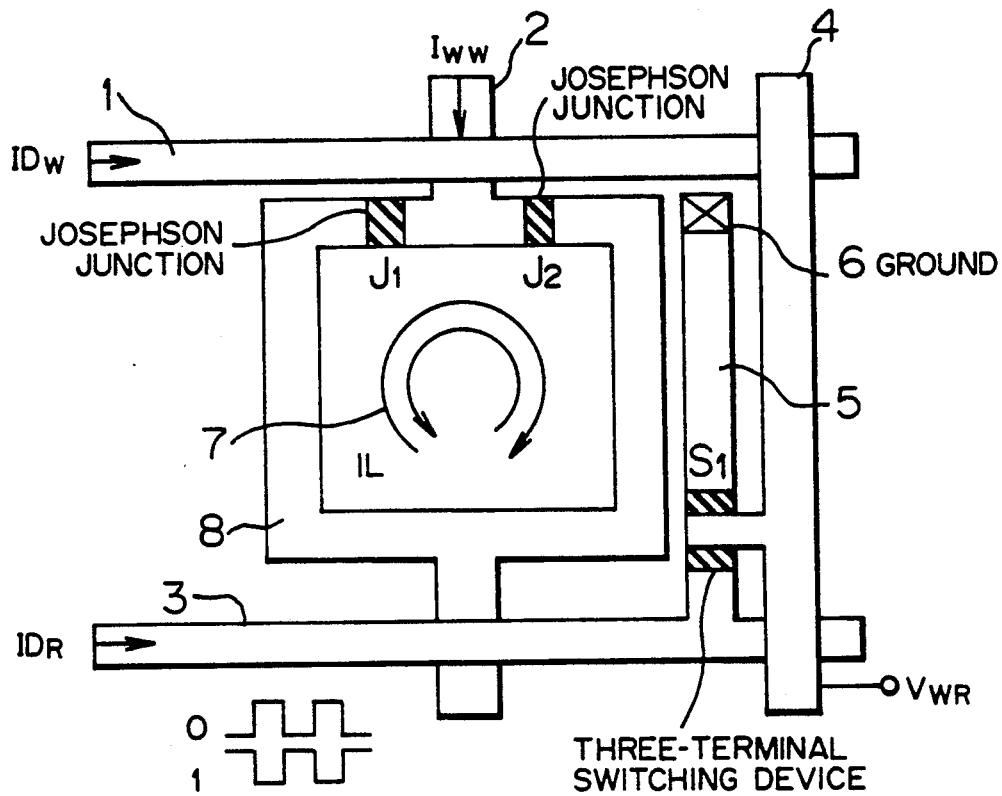
FIG. 5 shows an embodiment of a memory cell in which the quantum oscillation of a magnetic flux is used.

An embodiment of a quantum oscillation memory cell used in a quantum memory device of the present invention is shown in FIG. 5. The structure of a DC superconducting quantum interference device (SQUID), a write data line 1 and a write word line 2 is similar to that in the conventional Josephson memory. However, the junction area of each Josephson junction J1, J2 is so small (less than 0.01 $\mu m^2$) that the electrostatic energy of a Cooper pair can be on the same order as the pairing energy of a Cooper pair. By repeating the tunnel phenomenon of a magnetic flux state, as described in the conventional Josephson device, a flux oscillation occurs in a SQUID loop. In such a memory device using a magnetic field oscillating because of the above-mentioned quantum effect, not a static magnetic field but the oscillating magnetic field is stored as data. Therefore, a mechanism for detecting the oscillation of magnetic field is required as a data reading mechanism.

Figure 6:
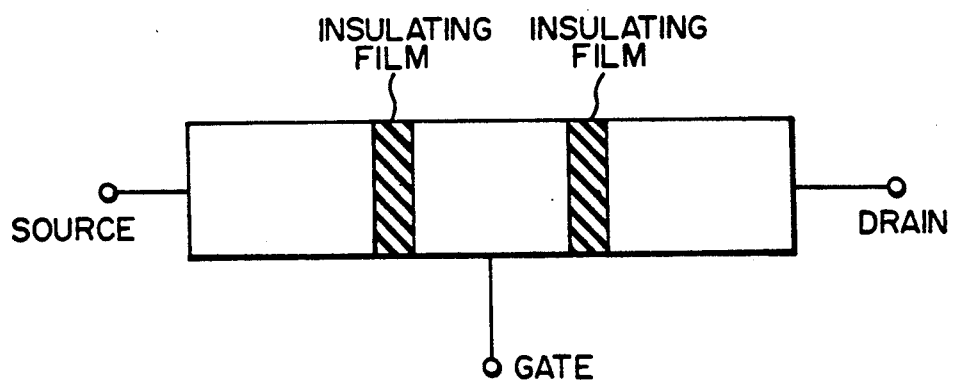
FIG. 6 shows an embodiment of a single electron transistor.

In the conventional Josephson memory, the third Josephson junction J3 is required for detection of a magnetic field. On the other hand, in the quantum oscillation memory of the present invention, a magnetic field detecting line 5 which is magnetically coupled with the SQUID ring is used in stead of the Josephson junction. One end 6 of the magnetic field detecting line 5 is connected to a ground plane and the other end thereof is connected to a read data line 3 through a three-terminal switching device or switching transistor S1. A gate of S1 is connected to a read word line 4. When a voltage is applied to the read word line, the device S1 is brought into an ON state. As the device S1, a single electron transistor proposed by, for example, K. K. Likharev, IEEE Transaction on Magnetics, Vol. MAG-23, No. 2, pp. 1142–1145, March 1987 can be used. As shown in FIG. 6, the single electron transistor has a structure in which two small capacitances are connected in series and a gate to which a gate voltage is applied is provided at a portion sandwiched between two tunnel insulating films. An equivalent resistance of the Josephson junction of the Josephson device is larger than 10 KΩ. As shown in FIG. 5, a source or, a drain and a gate are connected to the magnetic field detecting line 5, the read data line 3 and the read word line 4, respectively. By using the single electron transistor as the three-terminal switching device, it is possible to form the memory cell using Josephson junctions each of which has the same structure. As a result, a fabrication process is greatly simplified. This three-terminal switching device holds an OFF state due to a Coulomb blockade phenomenon in a state in which no voltage is applied to the read word line 4, and is released from the Coulomb blockade to flow a tunnel current in a state in which a voltage is applied. Thus, a switching operation is performed.

Figure 7:
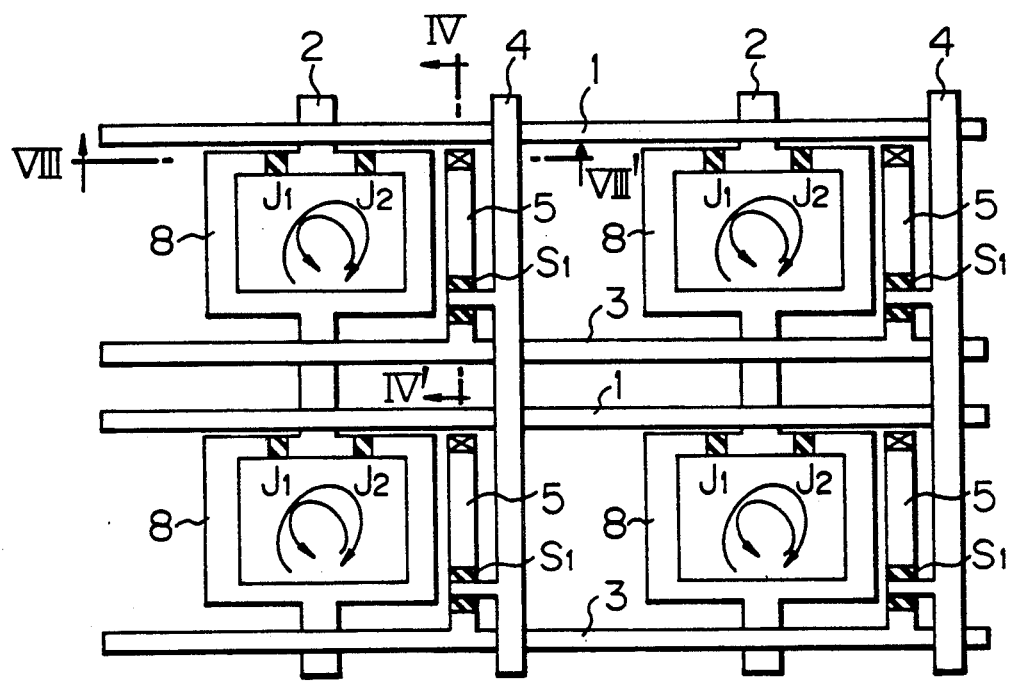
FIG. 7 shows an embodiment of a memory device in which quantum flux oscillation memory cells are arranged.
Figure 8:
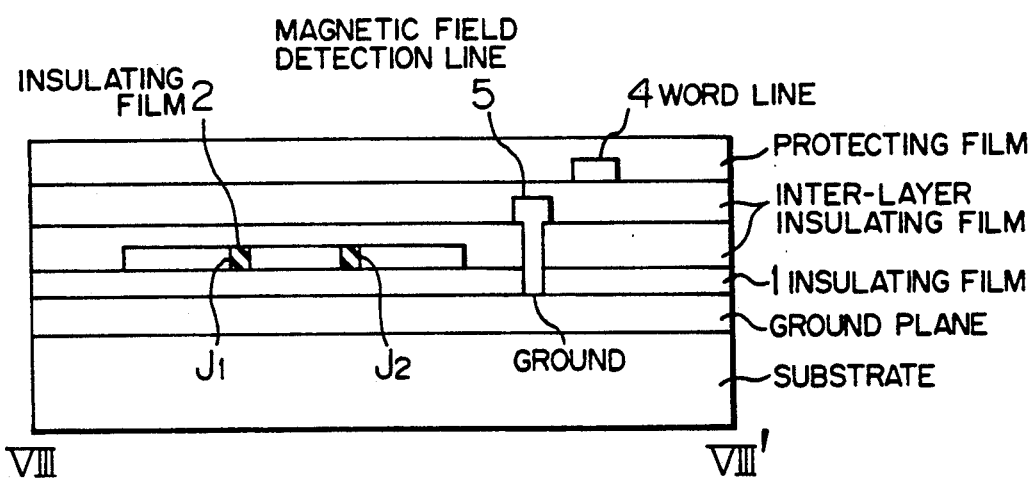
FIG. 8 shows a cross section of the memory cell taken along line VIII—VIII' in FIG. 7.
Figure 9:
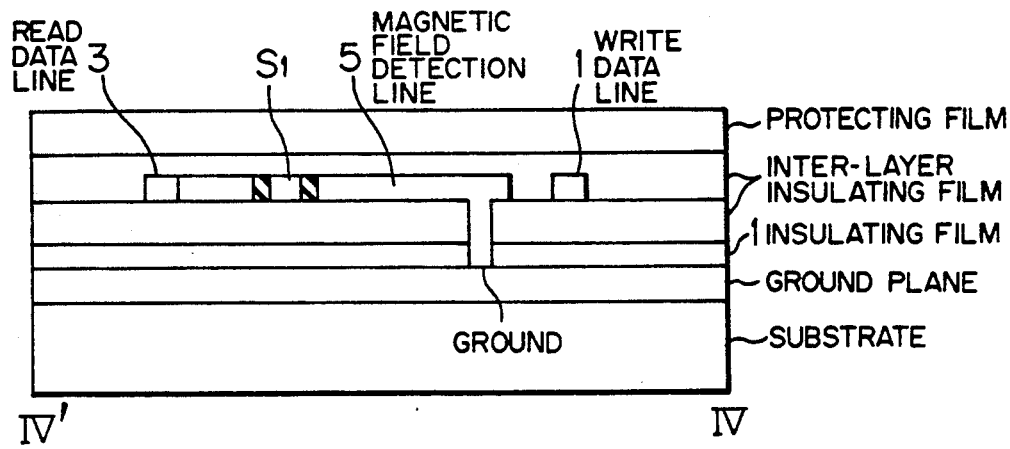
FIG. 9 shows a cross section of the memory cell taken along line IV—IV' in FIG. 7.

FIG. 7 shows a plan view when memory cells as shown in FIG. 5 are arranged in a matrix form. FIGS. 8 and 9 are cross sections of a memory cell taken along line VIII—VIII' and line IV—IV' in FIG. 7, respectively.

Figure 10:
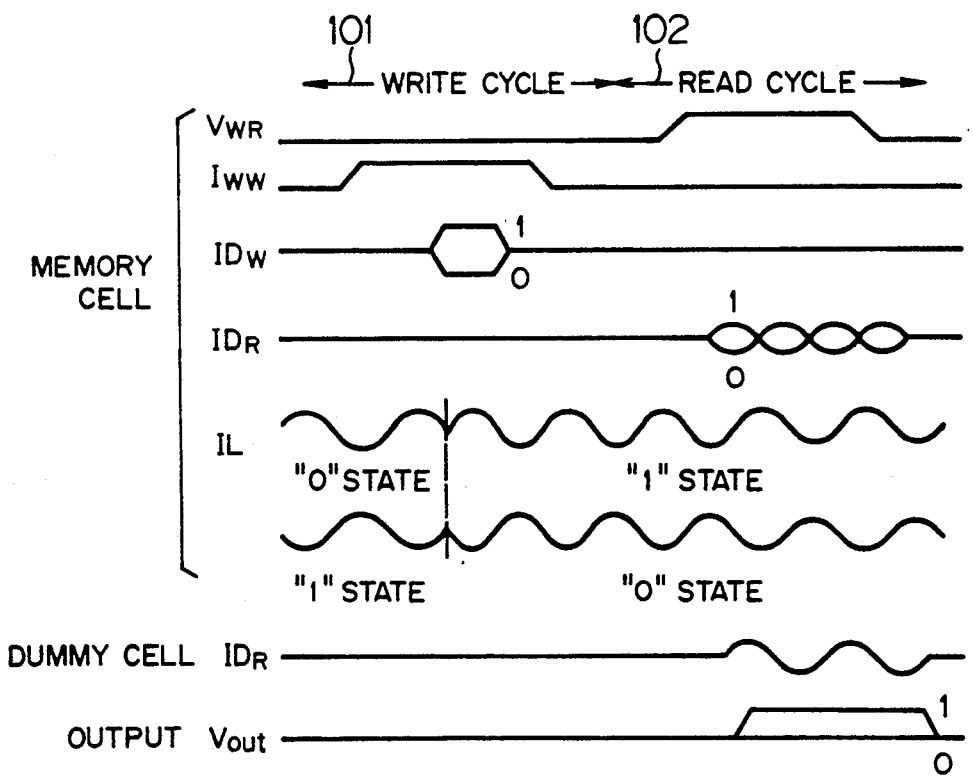
FIG. 10 shows a timing chart of the operation of the quantum flux oscillation memory.

The memory cell shown in FIG. 5 operates in accordance with a timing chart shown in FIG. 10. In a case where data is to be written (or in a write cycle 101), a current $ID_w$ on the data line 1 is set to a high or 0 level in accordance with data of "1" or "0" to be written in a state in which a current $I_{ww}$ is flown in the write word line 2, this similar to the conventional Josephson memory. As a result, a loop current 7 (IL) is induced in the SQUID and a magnetic flux trapped in a superconducting loop 8 is $\phi_0$ or 0. This flux state is unstable and continues to oscillate at a fixed period. The phase of the oscillation is different by 180° between the case where the written data is "1" and the case where it is "0".

In a case where data is to be read (or in a read cycle 102), a voltage $V_{wR}$ Of the read word line 4 is turned to a high level to bring the three-terminal device S1 into an ON state. As a result, an oscillating current $ID_R$ flows due to the loop current 7 (IL) and the phase of the current $ID_R$ in a case of data "1" is different by 180° from that in a case of data "0". This oscillating current $ID_R$ is compared with a current corresponding to data read from a dummy cell, as will be mentioned later on. If the phases of both the currents coincide with each other, an output voltage $V_{out}$ takes a high level. If both the phases are inverse to each other, the output voltage $V_{out}$ is 0. Thus, the data stored in the memory cell is determined.

Figure 11:
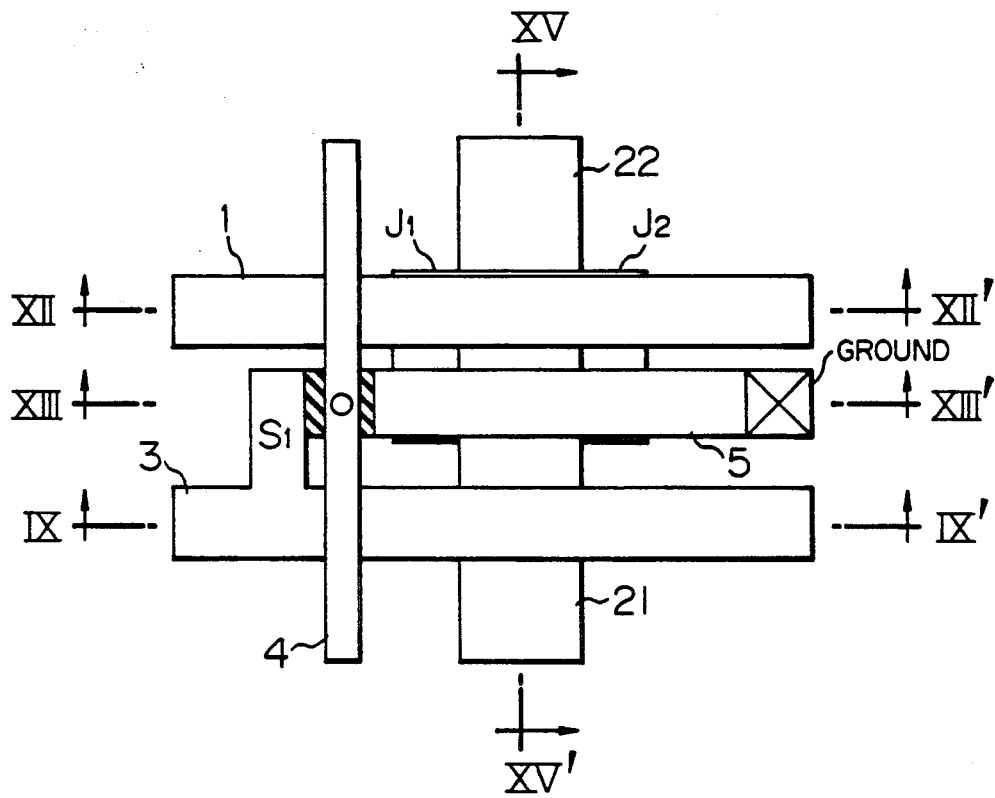
FIG. 11 shows an embodiment of a quantum flux oscillation memory cell in which a SQUID ring is made orthogonal to a substrate surface to reduce a cell area.
Figure 12:
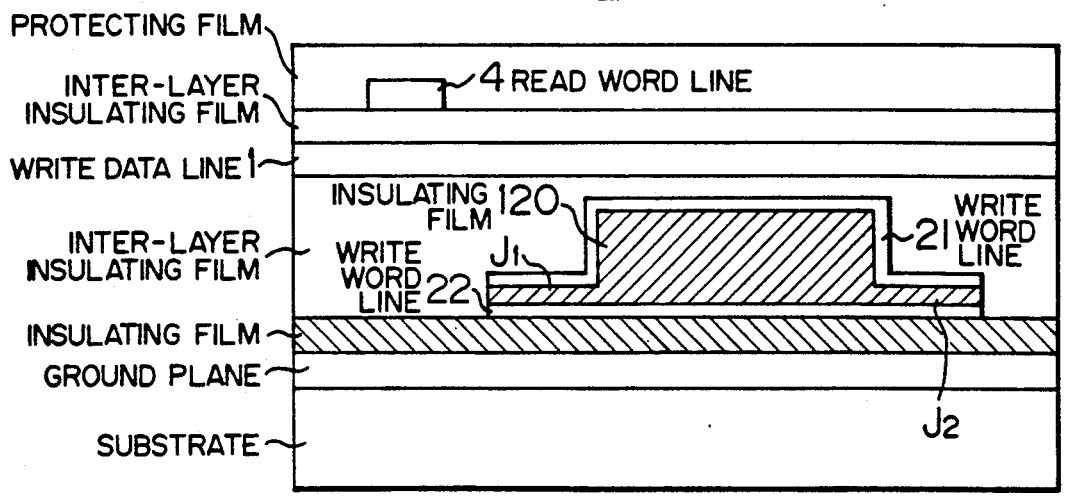
FIG. 12 shows a cross section of the memory cell taken along line XII—XII' in FIG. 11.
Figure 13:
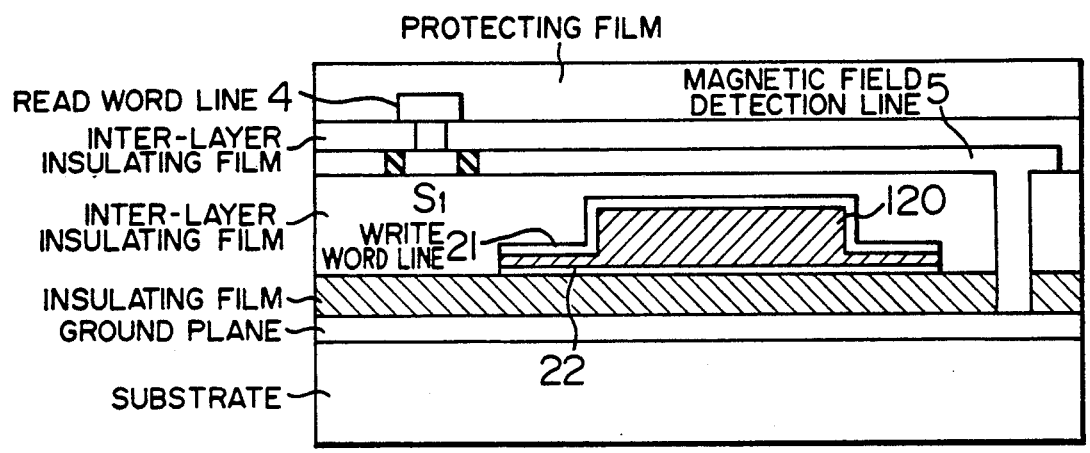
FIG. 13 shows a cross section of the memory cell taken along line XIII—XIII' in FIG. 11.
Figure 14:
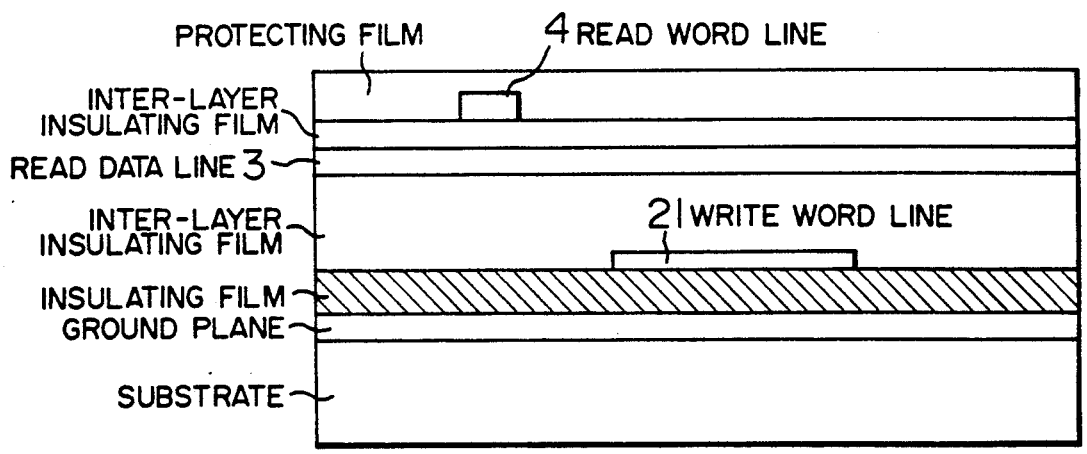
FIG. 14 shows a cross section of the memory cell taken along line IX—IX' in FIG. 11.
Figure 15:
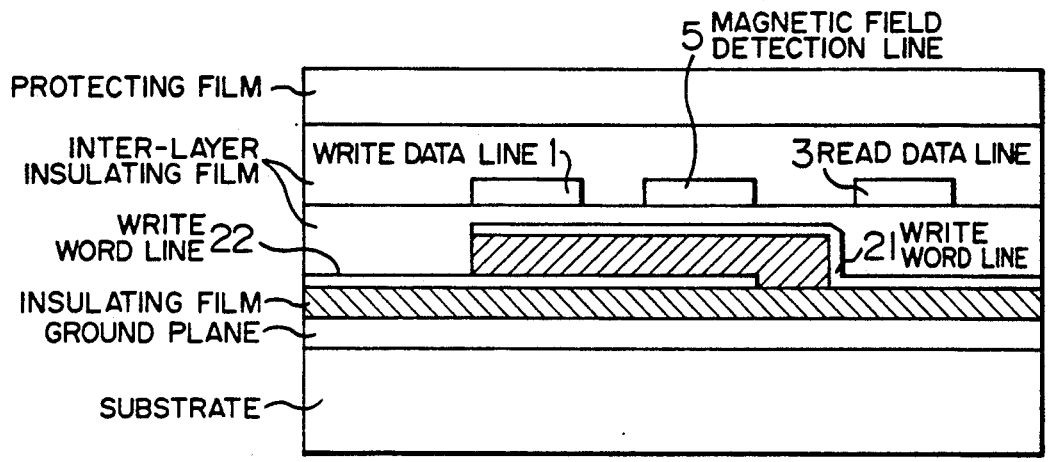
FIG. 15 shows a cross section of the memory cell taken along line XV—XV' in FIG. 11.
Figure 16:
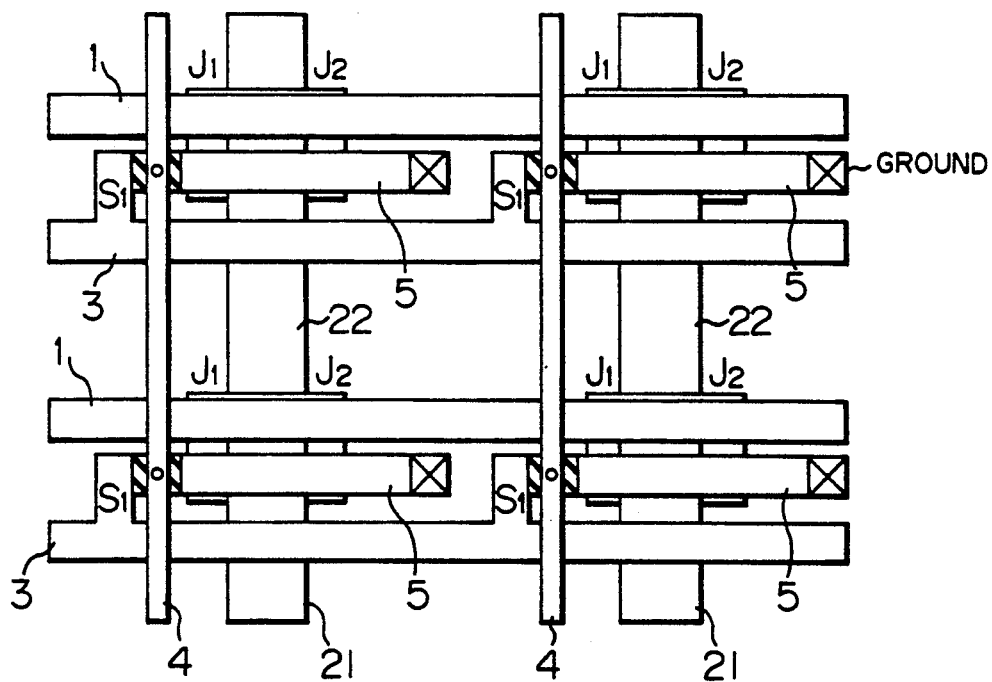
FIG. 16 shows the arrangement of quantum flux oscillation memory cells.

In the embodiment shown in FIG. 5, even if the area of the Josephson junction is reduced, the large area of the superconducting ring 8 of the SQUID hinders the memory cells from being highly integrated. An embodiment of a memory cell structure free of this drawback is shown in FIG. 11. FIGS. 12, 13, 14 and 15 show cross sections of the memory cell taken along line XII—XII', line XIII—XIII', line IX—IX' and line XV—XV' in FIG. 11, respectively. In this embodiment, a superconducting ring of a SQUID, in which a magnetic flux is trapped, is formed on a cross-sectional plane perpendicular to a substrate, as shown in FIGS. 12 and 13, and a magnetic field produced by a loop current is therefore generated in a direction perpendicular to a plane of the paper. A write word line includes two portions 21 and 22 which are separated by a thick insulating film 120 and connected through tunnel Josephson junctions J1 and J2 each formed at a thin portion of the insulating film 120. Namely, the write word line 21 branches into right and left portions which are then connected through the Josephson junctions J1 and J2 at the thin film portions to the write word line 22 for another memory cell, thereby forming a superconducting ring. A write data line 1 is wired or formed above the write word line 21 in a direction orthogonal to the write word line 21. Similarly, a magnetic field detecting line 5 is formed in parallel with the superconducting loop of the SQUID as shown in the cross section of FIG. 13 so that it magnetically couples with the SQUID to detect an oscillating magnetic field. FIG. 16 shows a quantum memory device in which memory cells as shown in FIG. 5 are arranged in a matrix form.

Figure 17:
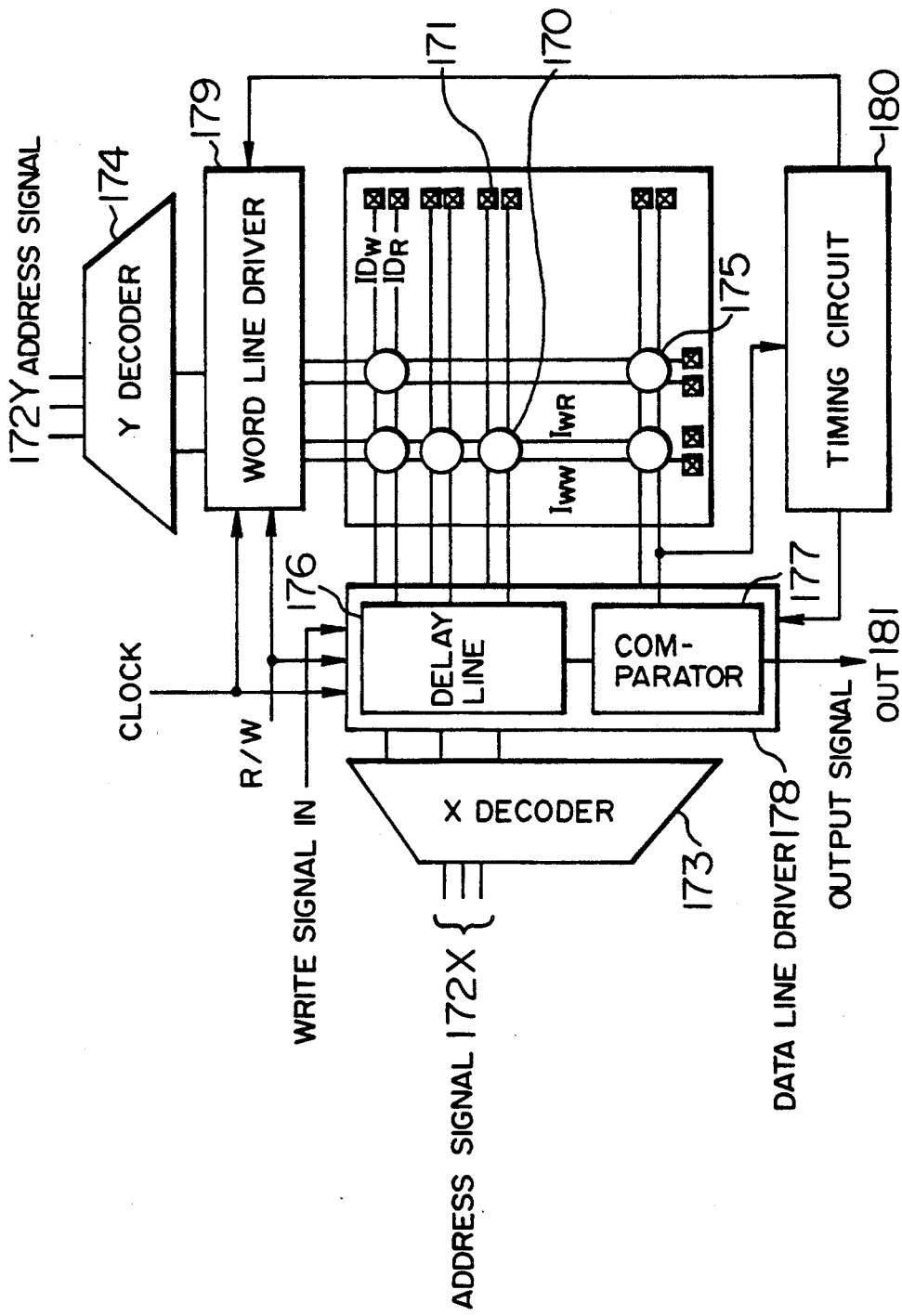
FIG. 17 shows a circuit diagram of the whole of a quantum flux oscillation memory.
Figure 18:
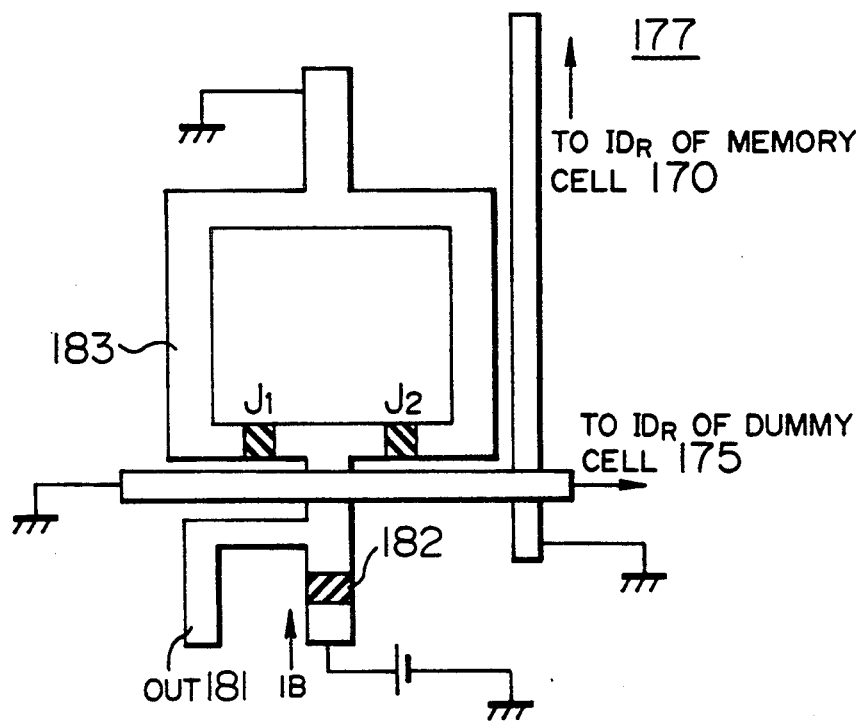
FIG. 18 shows a circuit for comparing memory cell data and dummy cell data.

FIG. 17 shows the circuit construction of the whole of a quantum oscillation memory device. Memory cells 170 are arranged in a matrix form, as shown in FIG. 7 or 16. Data lines $ID_w$ and $ID_R$ and word lines $I_{ww}$ and $I_{wR}$ are connected to each memory cell. These lines form superconducting stripe lines and a terminator 171 which matches to characteristic impedance is connected to an end of each line. When the address of a memory cell to be accessed is given as address signals 172X and 172Y, an addressed memory cell 170 is selected by an X decoder 173 and a Y decoder 174 as in an ordinary Josephson memory or semiconductor memory. One column of the memory array is allotted for dummy cells 175 each of which is used as a reference for determining the phase of a flux oscillation of the other or memory cell 170. Predetermined data has been written in the dummy cell. A signal of data read from the memory cell 170 is sent to a comparator 177 through a delay line 176 in a data line driver 178 and is compared by the comparator 177 with a signal of data read from the dummy cell 175. The delay line 176 is provided such that the delay of propagation from each memory cell 170 to the comparator 177 coincides with that from the dummy cell 175 to the comparator 177, thereby making it possible to precisely detect the phase of a flux oscillation of each memory cell 170. A timing circuit 180 makes a control as shown in FIG. 10 for the data line driver 178 and a word line driver 179 on the basis of a signal from the dummy cell 175. The comparator 177 can be constructed using, for example, an AND gate formed by a DC-SQUID, as shown in FIG. 18. A bias current $I_B$ is supplied to a SQUID 183 through a load resistance 182.

If the phase of a signal on the read data line $ID_R$ of the memory cell 170 and that on a read data line $ID_R$ of the dummy cell 175 coincide with each other, the SQUID 183 makes a transition to a definite-voltage state so that a voltage or an output signal is generated at an output terminal (OUT) 181. In the case where an energy dissipation of the Josephson junction is not sufficiently small, the oscillation of a magnetic flux decays with the lapse of time. In such a case, it is necessary to periodically refresh each of the cells 170 and 175.

Figure 20:
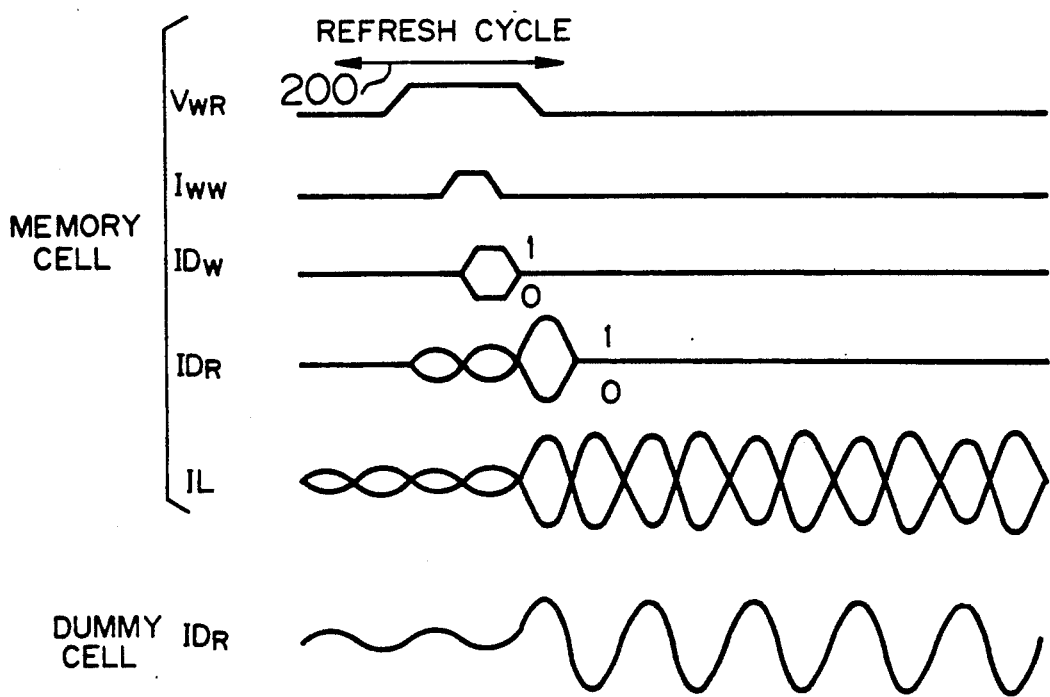
FIG. 20 shows a refresh operation of the quantum flux oscillation memory shown in FIG. 19.
Figure 19:
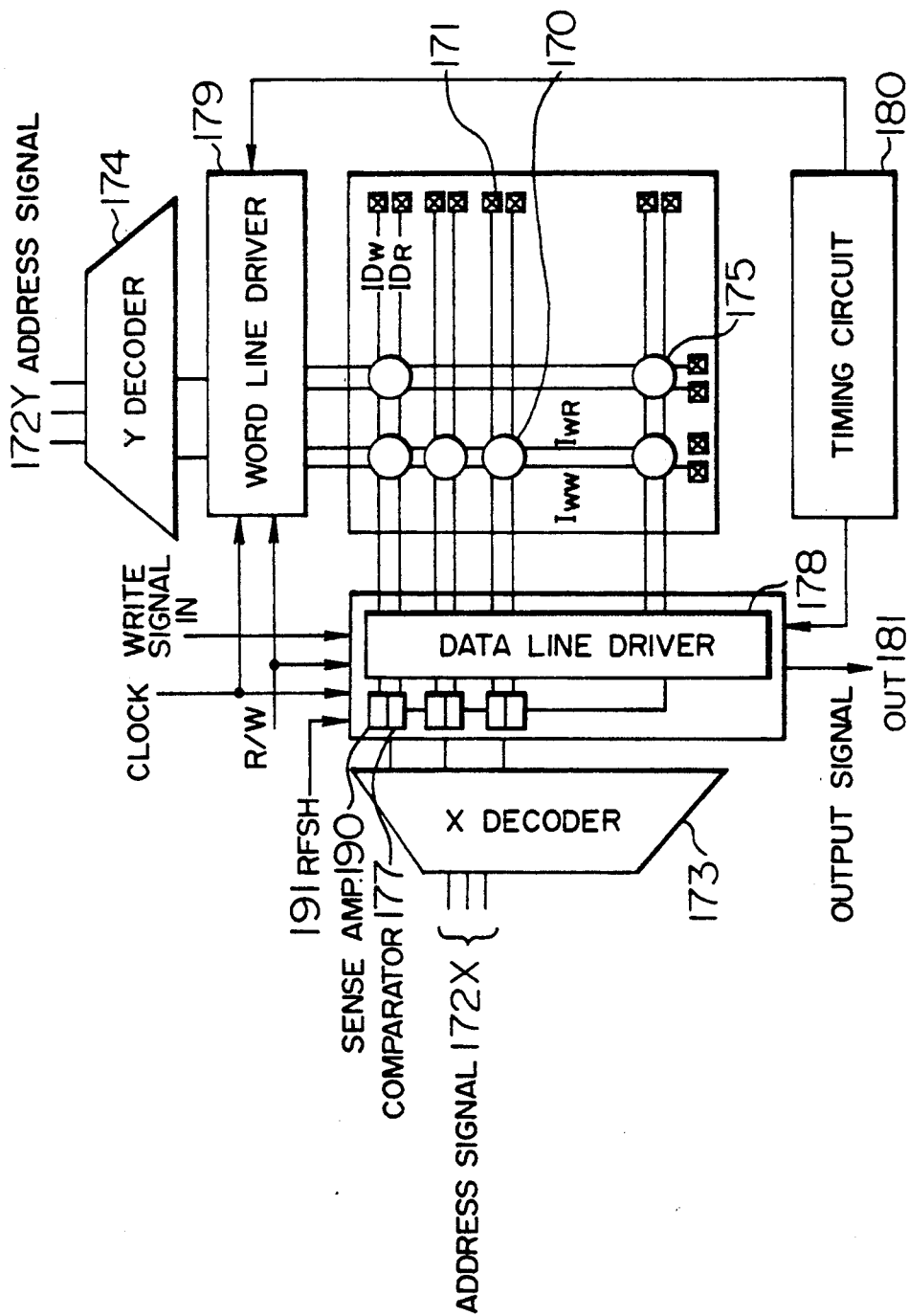
FIG. 19 shows a circuit diagram of the whole of a quantum flux oscillation memory with refresh function.

FIG. 19 shows an embodiment of a dynamic memory having the above-mentioned refresh function, and FIG. 20 shows a timing chart of a refresh cycle. In the present embodiment, one comparator 177 and one sense amplifier 190 are provided for each data line in order to simultaneously refresh a plurality of cells connected to the same word line. The construction of a quantum memory device shown in FIG. 19 is substantially the same as that of the device shown in FIG. 17. In a memory refresh cycle 200 shown in FIG. 20, a RFSH signal 191 is turned to a high level and an address signal 172Y for a row to be refreshed is applied to a Y decoder 174. In a row selected by the Y decoder 174, a write word line $I_{ww}$ and a write data line $ID_w$ are driven by a word line driver 179 SO that $V_{wR}$ and $I_{ww}$ take high levels, as shown in FIG. 20. As a result, an induced current is produced On each read data line $ID_R$. $ID_R$ signals of a memory cell 170 and a dummy cell 175 are subjected to discrimination of "0" or "1" by the comparator 177 and the $ID_R$ signal of the memory cell 170 is amplified by the sense amplifier 190. A data line driver 178 drives the write data line $ID_w$ in accordance with the amplified signal from the sense amplifier 190 to supply it on the write data line $ID_w$ to a corresponding row. By the above operation, all cells in the column selected by the Y decoder 174 are refreshed.

Figure 21A:
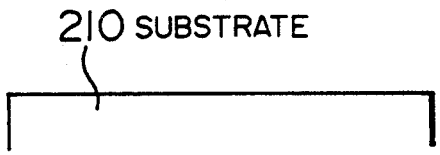
FIGS. 21A to 21K and 22 show the outline of a method for fabrication of a flux quantum tunnel memory.
Figure 21B:
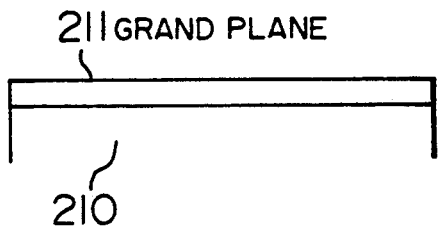
Figure 21C:
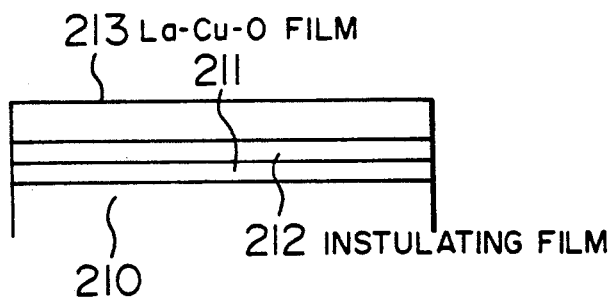
Figure 21D:
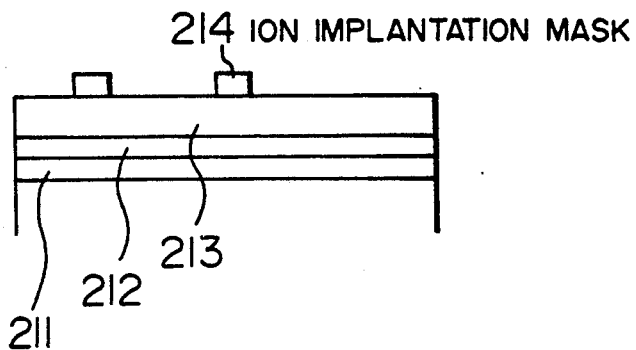

Next, an embodiment of a process for fabrication of the memory cell shown in FIG. 5 will be explained by use of FIGS. 21A to 21K and 22 and 25B, and 26. First, a substrate 210 is prepared, as shown in FIG. 21A. Next, a superconductor material, for example, a high temperature superconductor of oxide material Ba-La-Cu-O or Ba-Y-Cu-O is deposited on the substrate 210 so that a superconducting ground plane 211 is formed by a heat treatment (see FIG. 21B). As shown in FIG. 21C, silicon oxide as an insulating film 212 is deposited through CVD and La-Cu-O or Y-Cu-O is thereafter deposited to form a thin ceramic film 213. In order to etch only portions where a superconductor portion is desired, an insulating film 214 is formed as an ion implantation mask on the thin ceramic film (La-Cu-O) 213 (see FIG. 21D).

Figure 21E:
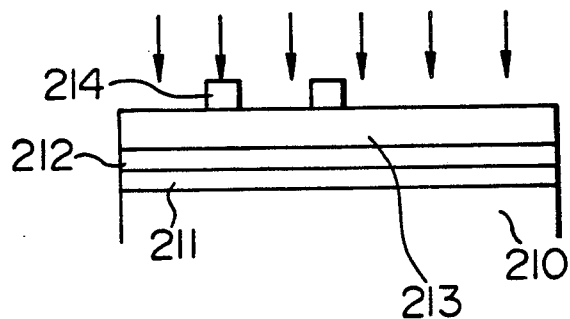
Figure 21F:
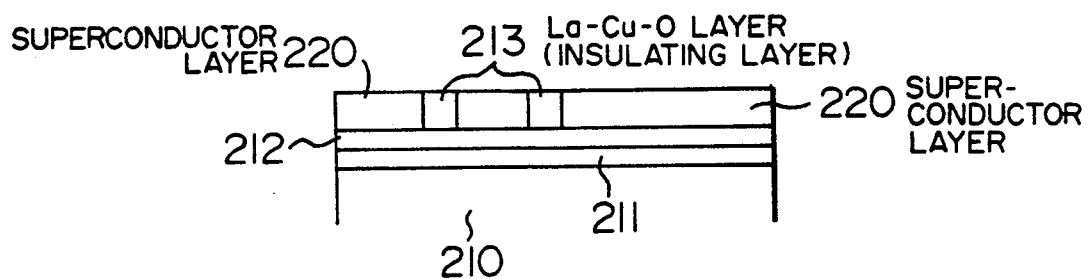
Figure 21G:
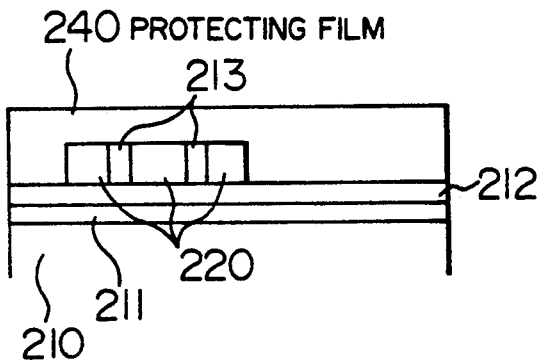
Figure 21H:
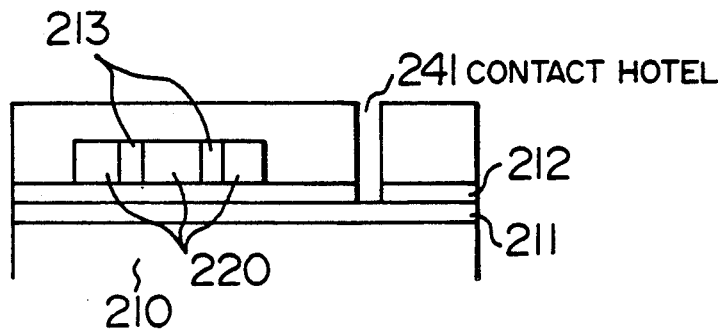
Figure 22:
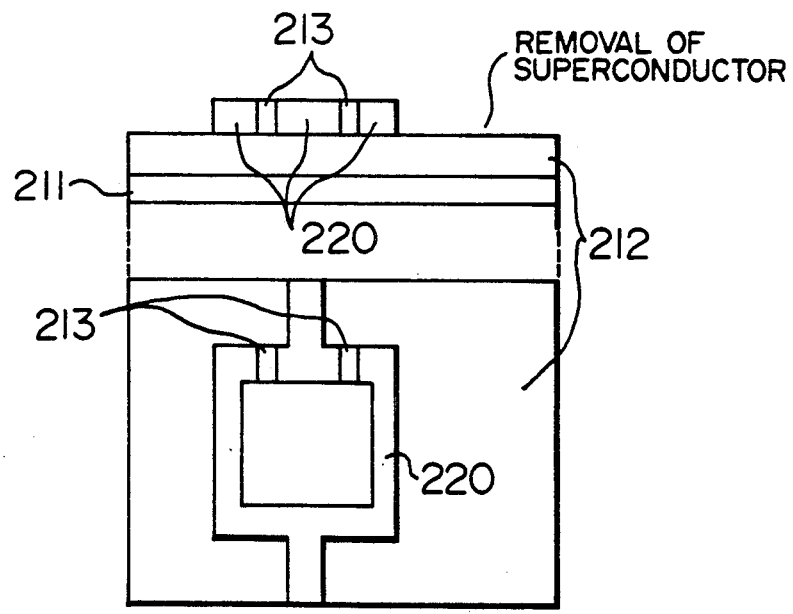

Next, Ba or Sr ions are implanted as an impurity, as shown in FIG. 21E. After the impurity ions have been implanted, the structure is subjected to a heat treatment to make the conversion to a superconductor and the insulating film as the ion implantation mask is then removed (see FIG. 21F). By the above process, a thin film including superconductor layers 220 and insulating layers 213 in a mixed form is formed. Unnecessary superconductor portions are etched away, as shown in FIG. 22. At a point of time when this process is completed, Josephson junctions and a SQUID are formed on the insulating film 212. Subsequently, a protecting film 240 for wiring patterns is formed on the Josephson junctions and the SQUID (see FIG. 21G) and a contact hole 241 for wiring is provided (see FIG. 21H). An insulating film as the protecting film may be a protecting film such as silicon oxide used in the conventional semiconductor manufacturing process.

Figure 21I:
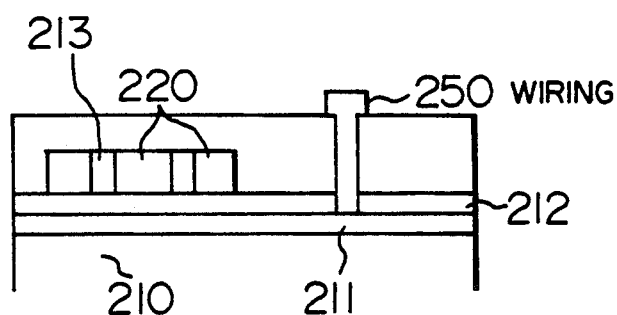
Figure 21J:
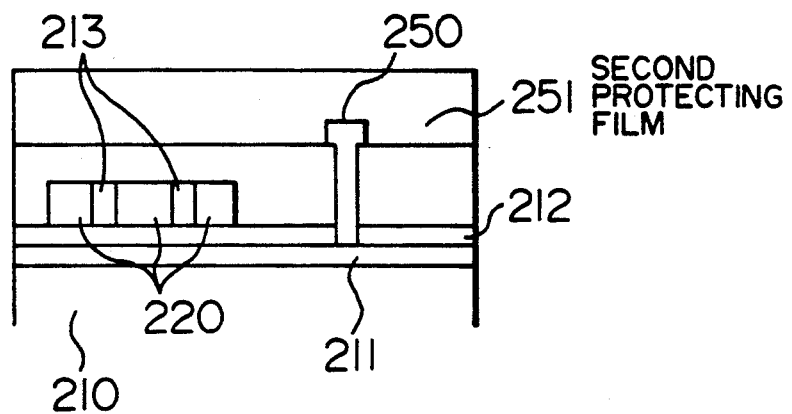
Figure 21K:
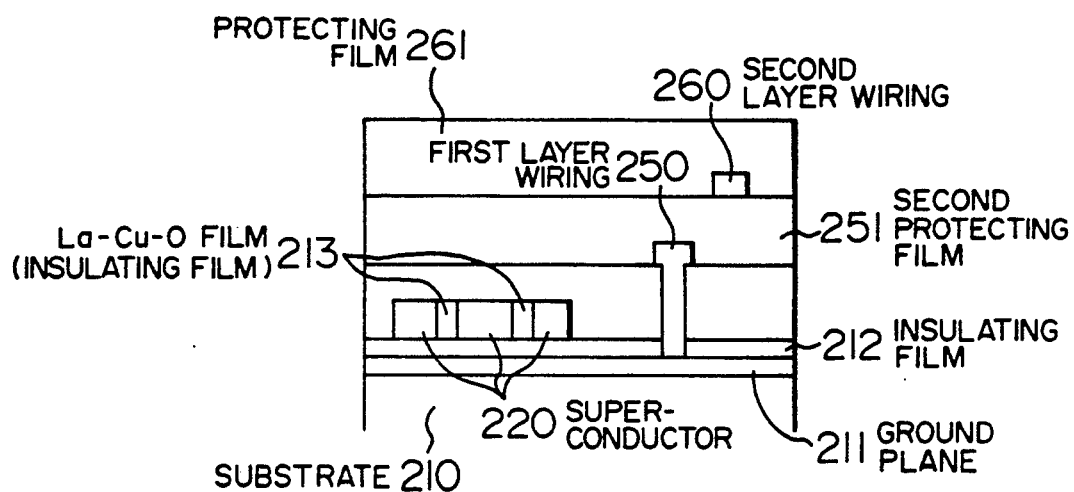

Next, as shown in FIG. 21I, a wiring 250 is formed in the contact hole 241. The wiring 250 is formed by depositing the same high temperature superconductor material as the junction material or depositing a superconductor material such as niobium (Nb) through sputtering. In the case where a second (and subsequent) layer wiring is provided after the first layer wiring has been formed, a second protecting film 251 for wiring patterns is formed on the first layer wiring and subsequently a wiring process similar to the first layer wiring 250 is repeated (see FIG. 21J). After the final layer wiring (or a second layer wiring 260) has been formed, a protecting film 261 is formed on the final layer wiring (see FIG. 21K), thereby completing the process for fabrication of the quantum memory device.

According to a quantum memory device of the present invention, not the presence/absence of a magnetic flux but the phase of a flux oscillation is stored as information. Therefore, it is possible to avoid the problem of information vanishing due to the tunnel effect. Also, it is possible to attain the reduction in size of a junction area which has hitherto been limited due to thermal fluctuation or quantum-mechanical fluctuation. A decrease of the capacitance of a junction attendant upon the reduction in size of the junction area brings about the decrease of a time of transition from a voltage state to a zero-voltage state, thereby attaining both a high integration and a high speed.

We claim:

1. A quantum memory device comprising:
 a plurality of memory cells, each of which includes:
 retaining means for retaining magnetic flux, said retaining means including a superconducting quantum inference device (SQUID), in which a Josephson junction of a Josephson device has a junction area not larger than a first predetermined value, an energy gap of a superconductor is on the same order as an electrostatic energy of a Cooper pair to cause a quantum fluctuation, and a decay time of a magnetic flux trapped in the SQUID due to macroscopic tunnel is shorter than a requested data retention time,
 writing means for causing said SQUID to generate oscillating magnetic flux whose phase is determined in accordance with information to be stored in the memory cell, and
 reading means for detecting the phase of the oscillating magnetic flux and outputting the store and information.

2. A quantum memory device according to claim 1, wherein said first predetermined value is 0.01 square microns.

3. A quantum memory device according to claim 2, wherein an equivalent resistance of the Josephson junction of the Josephson device is larger than a second predetermined value such that the magnetic flux subjected to tunnelling returns to an original state again through tunnelling because of a small energy dissipation in a macroscopic tunnel and this process is repeated to oscillate the magnetic flux, whereby information is stored with the phase of the oscillation of the magnetic flux being taken as a unit of storage.

4. A quantum memory device according to claim 1, wherein each of said plurality of quantum memory cells forming the quantum memory device includes the SQUID having first and second Josephson junctions, a write word line for supplying a current to the SQUID, a write data line magnetically coupled with the SQUID and a magnetic field detection line magnetically coupled with the SQUID the magnetic field detection line being connected to a read data line through a three-terminal switching device, and a read word line being connected to a gate of the three-terminal switching device.

5. A quantum memory device according to claim 4, wherein a plane of a current loop of the SQUID, the write data line and the magnetic field detection line are orthogonal to a memory substrate surface such that a magnetic field having a direction parallel to the memory substrate surface serves as a control magnetic field.

6. A quantum memory device according to claim 4, wherein the plurality of memory cells are arranged in a matrix form with one column of the matrix being used as dummy cells to which a fixed oscillating magnetic flux is given and the phase of the oscillating magnetic flux of each of the memory cells in the other columns of the matrix is detected with the fixed oscillating magnetic flux of the corresponding dummy cell being taken as a reference.

7. A quantum memory device according to claim 4, wherein the junction area of the Josephson device forming the SQUID is not larger than a third predetermined value, and the information written in the SQUID is rewritten by a refresh circuit to compensate for decay of the oscillating magnetic flux due to macroscopic tunnel or thermal excitation.

8. A quantum memory device according to claim 4, wherein the three-terminal switching device includes a single electron transistor having a series connection of first and second capacitances.

9. A quantum memory device according to claim 4, wherein said SQUID comprises:
a first thin super-conducting film formed on a first
a second insulating film formed on said first thin superconducting film and having two thin portions; and
a second thin superconducting film formed on said second insulating film such that Josephson devices are formed at said two thin portions of said second insulating film so that superconducting quantum interference devices are formed by said first and second thin superconducting films.

10. A quantum memory device according to claim 9, wherein said second thin superconducting film is formed of La-Cu-O or Y-Cu-O.

11. A quantum memory device according to claim 1, wherein said second predetermined value is 10 kiloohms.

12. A quantum memory device according to claim 1, wherein said third predetermined value is 0.01 square microns.

13. A quantum memory device, comprising:
a plurality of interconnected memory cells, each memory cell comprises:
a superconducting quantum interference device (SQUID) for retaining oscillating magnetic flux which decays with time,
writing means for writing write information in the memory cell such that the SQUID of the memory cell generates and retains the oscillating magnetic flux determined in accordance with the write information, and
reading means for sensing an induction current signal due to the oscillating magnetic flux from the memory cell, comparing the sensed induction current signal with a predetermined signal, and outputting read information in accordance with the comparing result.

14. A quantum memory device according to claim 13, wherein said reading means includes means for comparing the sensed signal and the predetermined signal in phase.

15. A quantum memory device according to claim 14, wherein said plurality of memory cells includes a dummy cell for storing predetermined information, and said reading means further comprises means for sensing the predetermined signal from the dummy cell.

16. A quantum memory device according to claim 13, wherein said plurality of memory cells are formed on a substrate, and the SQUID is formed vertically to the substrate.

17. A quantum memory device according to claim 13, wherein said plurality of memory cells are formed on a substrate, and the SQUID is formed parallel to the substrate.

18. A quantum memory device according to claim 13, wherein said reading means includes:
a sensing portion for sensing the induction current signal due to the oscillating magnetic flux;
an information read line for transferring the sensed induction current signal; and
a switching element for controlling the transfer of the sensed induction current signal in response to an input control signal.

19. A quantum memory device according to claim 18, wherein said switching element is a single electron transistor.

20. A quantum memory device according to claim 13, further comprising refreshing means for refreshing said plurality of memory cells.

21. A quantum memory device, comprising:
a plurality of interconnected memory cells, each memory cell comprises:
a superconducting quantum interference device (SQUID) having two Josephson junctions,
a write word line for supplying a current to said SQUID;
a data writing line magnetically coupled to said SQUID, said SQUID generating oscillating magnetic flux based on the current from said write word line and data from said data writing line,
a magnetic field sensing line magnetically coupled to said SQUID,
a data reading line,
a read word line for transferring a control signal, and
a switching element disposed between said magnetic field sensing line and said data reading line, for controlling an induction current as the sensed magnetic field to be transferred from said sensing line to said data reading line in response to the control signal from said read word line.

22. A quantum memory device according to claim 21, wherein one of said plurality of memory cells is a dummy cell, and said quantum memory device further comprises read means for receiving the induction current from the memory cell and a reference induction current from the dummy cell, and comparing the received currents in phase to read data stored in the memory cell.

23. A quantum memory device according to claim 21, wherein each of said Josephson junctions has so small junction area that the magnetic flux due to current flowing in the SQUID can oscillate.

* * * * *